(12) United States Patent
Pan et al.

(10) Patent No.: US 7,062,848 B2
(45) Date of Patent: Jun. 20, 2006

(54) PRINTABLE COMPOSITIONS HAVING ANISOMETRIC NANOSTRUCTURES FOR USE IN PRINTED ELECTRONICS

(75) Inventors: Alfred I-Tsung Pan, Sunnyvale, CA (US); Yoocham Jeon, Palo Alt, CA (US); Scott Haubrich, Castro Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/665,335

(22) Filed: Sep. 18, 2003

(65) Prior Publication Data
US 2005/0074589 A1 Apr. 7, 2005

(51) Int. Cl.
H05K 3/10 (2006.01)
H01B 1/00 (2006.01)

(52) U.S. Cl. .......................... 29/825; 29/829; 977/786; 252/500

(58) Field of Classification Search ............... 252/500; 438/3; 29/825, 829
See application file for complete search history.

(56) References Cited

U.S. PATENT DOCUMENTS

| | | | |
|---|---|---|---|
| 5,098,771 A * | 3/1992 | Friend | 428/209 |
| 5,853,877 A * | 12/1998 | Shibuta | 428/357 |
| 5,882,722 A | 3/1999 | Kydd | |
| 5,908,585 A * | 6/1999 | Shibuta | 252/506 |
| 6,139,919 A * | 10/2000 | Eklund et al. | 427/430.1 |
| 6,248,674 B1 | 6/2001 | Kamins et al. | |
| 6,537,359 B1 | 3/2003 | Spa | |
| 6,563,132 B1 | 5/2003 | Talroze et al. | |
| 6,586,095 B1 | 7/2003 | Wang et al. | |
| 6,705,910 B1 * | 3/2004 | Sheu et al. | 445/24 |
| 6,713,947 B1 * | 3/2004 | Hirasawa et al. | 313/313 |
| 6,741,019 B1 * | 5/2004 | Filas et al. | 313/355 |
| 6,914,381 B1 * | 7/2005 | Okai et al. | 313/497 |
| 2002/0005876 A1 | 1/2002 | Grimes et al. | |
| 2002/0132361 A1 | 9/2002 | Vossmeyer et al. | |
| 2003/0090190 A1 * | 5/2003 | Takai et al. | 313/311 |
| 2003/0092207 A1 * | 5/2003 | Yaniv et al. | 438/20 |
| 2003/0110978 A1 | 6/2003 | Noriyuki et al. | |
| 2003/0122111 A1 * | 7/2003 | Glatkowski | 252/500 |
| 2003/0164427 A1 * | 9/2003 | Glatkowski et al. | 244/158 R |
| 2004/0262582 A1 * | 12/2004 | Kirkor et al. | 252/500 |
| 2005/0095360 A1 * | 5/2005 | Li et al. | 427/240 |
| 2005/0156504 A1 * | 7/2005 | Takai et al. | 313/495 |
| 2005/0202578 A1 * | 9/2005 | Yaniv | 438/20 |

FOREIGN PATENT DOCUMENTS

| | | |
|---|---|---|
| EP | 1207572 | 5/2002 |
| GB | 2236116 | 3/1991 |
| JP | 02194040 | 7/1990 |
| JP | 2003-26981 | * 1/2003 |
| WO | WO 02/080637 | 10/2002 |

OTHER PUBLICATIONS

Murata, "Super-fine ink-jet printing for nanotechnology", Jul. 2003, Proceedings of the International Conference on MEMS, NANO and Smart Systems, 2003, pp. 346-349.*

Szczech et al., "Fine-line COnductor Manufacturing Using Drop-On-Demand PZT Printing Technology", IEEE Transactions on Electronics in Packaging, Jan. 2002, vol. 25, Issue 1, pp. 26-33.*

Hara, Akito, Fumiyo Takeuchi and Nobuo Sasaki, "Mobility enhancement limit of excimer-laser-crystallized polycrystalline silicon thin film transistors," Journal of Applied Physics, vol. 91, No. 2, pp. 708-714, Jan. 15, 2002.

Snow, E.S., J.P. Novak, P.M. Campbell and D. Park, "Random networks of carbon nanotubes as an electronic material," Applied Physics Letters, vol. 82, No. 13, pp. 2145-2147, Mar. 31, 2003.

Xia, Younan, Peidong Yang, Yugang Sun, Yiying Wu, Brian Mayers, Byron Gates, Yadong Yin, Franklin Kim and Haoquan Yan, "One-Dimensional Nanostructures: Synthesis, Characterization, and Applications," Advanced Materials 2003, 15, No. 5, pp. 353-389, Mar. 4, 2003.

* cited by examiner

Primary Examiner—Evan Pert

(57) ABSTRACT

Compositions and methods for production of conductive paths can include a printable composition including a liquid carrier and a plurality of nanostructures. The plurality of nanostructures can have an aspect ratio of at least about 5:1 within the liquid carrier. Examples of nanostructures include nanobelts, nanoplates, nanodiscs, nanowires, nanorods, and mixtures of these materials. These printable compositions can be used to form a conductive path on a substrate. The printable composition can be applied to a substrate using any number of conventional printing techniques. Following application of the printable composition, at least a portion of the liquid carrier can be removed such that the nanostructures can be in sufficient contact to provide a conductive path. The nanostructures arranged in a conductive path can be sintered or used as a conductive material without sintering.

39 Claims, No Drawings

PRINTABLE COMPOSITIONS HAVING
ANISOMETRIC NANOSTRUCTURES FOR
USE IN PRINTED ELECTRONICS

FIELD OF THE INVENTION

The present invention relates generally to printable compositions having nanostructures therein. More particularly, the present invention relates to printable compositions and methods for use in the production of a conductive path.

BACKGROUND OF THE INVENTION

Formation of electronic components and other conductive paths can be accomplished using a wide variety of known methods. Typical methods for manufacturing printed circuits include print and etch, screen printing, and photoresist methods, e.g., applying photoresist, exposing, and developing. Frequently, these methods involve considerable capital cost and production time. A number of methods have been explored to decrease costs associated with producing electronic components. Some of these methods include using various conventional printing techniques to apply a conductive material, or a precursor thereof, to produce a useful electronic circuit. Yet many of these methods are often unreliable or otherwise undesirable for commercial scale production. For this and other reasons, the need still exists for improved methods of forming conductive paths which have decreased manufacturing costs, allow for a wider variety of substrate materials, and which have improved electron mobility.

SUMMARY OF THE INVENTION

It has been recognized that it would be advantageous to develop improved methods and compositions for forming conductive paths on a substrate. In one aspect of the present invention, a printable composition can include a liquid carrier and a plurality of nanostructures. In one detailed aspect, the plurality of nanostructures can have an aspect ratio of at least about 5:1. Examples of nanostructures useful in the present invention include nanobelts, nanoplates, nanodiscs, nanowires, nanorods, and mixtures thereof.

A method of forming a conductive path on a substrate in accordance with the present invention can include applying the printable composition to a substrate. Following application of the printable composition, at least a portion of the liquid carrier can be removed. The nanostructures can be in sufficient contact to provide a conductive path. The nanostructures arranged in a conductive path can be sintered or cured used as a conductive material without sintering.

Additional features and advantages of the invention will be apparent from the following detailed description, which illustrates, by way of example, features of the invention.

DETAILED DESCRIPTION

Reference will now be made to exemplary embodiments and specific language will be used herein to describe the same. It will nevertheless be understood that no limitation of the scope of the invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a stabilizing agent" includes reference to one or more of such materials.

As used herein, "anisotropic" refers to a characteristic of a material in which properties can be directionally dependent. One property of interest in accordance with the present invention is physical dimension. Thus, the nanostructures used herein can have asymmetric dimensions, i.e. anisometric, such that a length is greater than a width of the particle. Those skilled in the art will recognize that other properties such as electrical resistivity, thermal conductivity, and others properties will often also be directionally dependent for the materials discussed herein.

As used herein, "aspect ratio" refers to the ratio of the longest dimension to the shortest dimension of a particle. Therefore, an increase in aspect ratio would indicate that the longest dimension has increased over the shortest dimension. For example, a nanowire having a 10 nm diameter and a length of about 30 µm has an aspect ratio of 3000:1. Further, an aspect ratio of 100:1 would be considered greater than an aspect ratio of 10:1. The dimensions are measured along edges or across a major axis to provide measurement of dimensions such as length, width, depth, and diameter. Thus, diagonal corner-to-corner measurements of dimension are not considered in the calculation of the aspect ratio. When referring to a plurality of nanostructures having a defined aspect ratio, what is meant is that all of the nanostructures of a composition as a whole have an average aspect ratio as defined.

As used herein, "nanostructure" refers to any particle or structure in which at least one dimension is in the nanometer range. Typically, the nanometer range can be from about 0.1 nm to about 100 nm. A wide variety of materials can be used to form such nanostructures and such are discussed below in more detail.

As used herein, "stabilizing agent" refers to a material which inhibits agglomeration or increases solubility of the plurality of nanostructures. Stabilizing agents can include chemically attached functional groups or ligands to form a coating around individual particles, or can include a coating which physically surrounds individual nanostructure particles.

As used herein, "conductive path" refers to any mass of material which exhibits electrically conductive properties. The mass of material can be particles which are in physical contact, sintered particles, or a partially or fully crystallized mass or film. Further, "conductive" is intended to encompass conductive, semi-conductive, and the like as distinguished from insulating materials. The conductive path can be an electronic trace or circuit or can be a conductive pattern, e.g., decorational or informational pattern.

As used herein, "liquid carrier" is defined to include liquid compositions that can be used to carry a plurality of nanostructures, a stabilizing agent, and other optional components to a substrate. Liquid carriers are well known in the art, and a wide variety of liquid carriers can be used in accordance with embodiments of the present invention. Such liquid carriers can include a mixture of a variety of different agents, including without limitation, surfactants, solvents, co-solvents, buffers, biocides, viscosity modifiers, molecular precursors, complexing agents, chelating agents, anti-kogation agents, reactive agents such as reducing agents, and water. Though a variety of agents are described that can be used, the liquid carrier, in some embodiments, can be simply a single liquid component, such as water. Though liquid carriers are described herein in some detail, it is to be understood that the amount of liquid carrier can vary over a wide range.

As used herein, "liquid vehicle" refers to a liquid carrier which is specifically configured for ink-jettable compositions. A liquid vehicle can therefore often include many of the same components as liquid carriers used for other ink application techniques. However, several unique considerations in selecting the components and amount of liquid vehicle can include viscosity, surface tension, pH, and those related to nucleation such as heat capacity, heat of vaporization, critical nucleation temperature, diffusivity, and the like.

As used herein, "ink-jetting" refers to the well known process of depositing liquids using ink-jet architecture, and is in no way limited to depositing inks or ink-containing compositions. Thus, although some embodiments of the present invention may include various inks, i.e. the presence of a colorant, this is not required. Similarly, ink-jetting of materials "on" a substrate can include direct contact of such material with the substrate or can indicate that the material is printed in contact with a separate material or layer which is in direct or indirect contact with the substrate.

It is important to note that, with respect to nanostructures, stabilizing agents, and other non-liquid carrier components, the weight percent values are measured relative to a wet basis, thus including the liquid carrier. In other words, unless otherwise specified, values of "wt %," "% by weight," and the like refer to the compositions that will be present in the printable composition including any carrier, such as before drying on a substrate.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 µm to about 200 µm should be interpreted to include not only the explicitly recited limits of 1 µm and about 200 µm, but also to include individual sizes such as 2 µm, 3 µm, 4 µm, and sub-ranges such as 10 µm to 50 µm, 20 µm to 100 µm, etc.

In accordance with the present invention, a printable composition can include a liquid carrier and a plurality of nanostructures. Other optional components can also be added in certain embodiments of the present invention as discussed below. Using the printable compositions of the present invention, a conductive path can be formed on a substrate using various printing or application methods. Each of these aspects is discussed in more detail below, along with additional alternative embodiments.

Nanostructures

In accordance with the present invention, a plurality of nanostructures can be included within the liquid carrier. The plurality of nanostructures can be nanobelts, nanoplates, nanodiscs, nanowires, nanorods, and combinations thereof. In one embodiment, the plurality of nanostructures can be nanobelts, nanoplates, nanodiscs, and combinations thereof. In another embodiment, the plurality of nanostructures can be nanowires or nanorods. In yet another embodiment, the plurality of nanostructures can be nanorods.

For the most part, these types of nanostructures are relatively recent developments, i.e. within about the past decade or so. Methods of forming such nanostructures are well known to those skilled in the art, although future developments are likely to produce additional methods. The primary principle behind growing or producing some of these nanostructures involves controlling the rate of growth along different crystal lattices to obtain a desired morphology. For example, to obtain one dimensional nanostructures such as nanowires, the energy for growth in one dimension is lowered relative to the other two dimensions. This can be achieved by suppressing, limiting, restricting, enhancing, promoting, and/or directing growth along the desired crystal lattice. Some successful methods for the synthesis of anisometric nanostructures include, but are not limited to, template synthesis, where growth is directed by the geometry of the template; vapor-phase techniques such as vapor-liquid-solid synthesis [VLS], where growth is limited in the lateral dimensions due to the solid-liquid interface; solvothermal methods; solution-phase techniques including the use of surface passifying agents to suppress growth along a dimension; solution-liquid-solid [SLS] techniques, which use the same basic principle as in VLS of a solid-liquid interface to direct growth; and the self-assembly of nanoparticles to obtain higher ordered nanostructures. In addition, it should be noted that many solid materials naturally grow into anisometric materials. An excellent survey of current methods of synthesizing nanostructures can be found in Y. Xia et al., *One-Dimensional Nanostructures: Synthesis, Characterization, and Applications*, Adv. Mater. 2003, 15, No. 5, 353–389, which is hereby incorporated by reference.

The nanostructures of the present invention can be formed of a wide variety of materials. For purposes of the present invention, nanostructures which are semi-conductive, conductive, or are formed of other electrically useful materials can be used. Non-limiting examples of suitable doped and undoped semi-conducting materials which can be used in forming nanostructures include Group IV elements such as Si and Ge; elements and compounds formed from Groups II and VI such as ZnO, ZnS, ZnSe, ZnTe, CdS, CdSe, CdO, CdTe, MgS, MgSe, MgTe, CaS, CaSe, CaTe, SrS, SrSe, SrTe, BaS, BaSe, and BaTe; elements and compounds formed from Groups III and V such as GaAs, InGaAs, InP, InAs, GaSb, InSb, and GaP; and other materials such as $Cu_2S$, $FeSi_2$, carbon nanotubes including doped carbon nanostructures, and other organic semiconductors. Suitable conducting materials include, without limitation, Cu, Ag, Au, Co, Pt, Pd, Ir, Rh, Os, Fe, Ni, and combinations or alloys thereof. Other suitable materials include GaN, GaSe, ITO (indium tin oxide), SnO, SiC, and $Bi_2S_3$. In one aspect, the nanostructures can be formed of inorganic or organic materials. Further, nanostructures formed of inorganic materials can be used in the present invention. In one alternative aspect, the plurality of nanostructures can be anisotropic materials.

The physical dimensions of nanostructures can vary considerably. The shortest dimension of a nanostructure is, by definition, in the nanometer range and is typically from about 0.1 nm to about 100 nm and most often from about 2 nm to about 50 nm. The longest dimension can range from tens of nanometers to a macroscopic scale in the range of millimeters. However, typical lengths can range from about 20 nm to about 100 μm. Specifically, nanobelts used in the present invention can have a thickness in the nanometer range while the width and length can vary, with the length typically being several times greater than the width, i.e. from two to several thousand times. These nanobelts typically have a width ranging from about 30 nm to about 300 nm, a thickness in the range of about 1 nm to about 15 nm, and a length of up to several hundred micrometers. These ribbon-like structures may either be grown to a desired particle size, or be cut down to a desired size using a microtome, laser, or other known device. Nanorods suitable for the present invention are typically relatively short cylindrical, or nearly cylindrical, structures which are substantially straight. For example, nanorod diameters can be in the nanometer range while the length can be from about 1 nm to about 200 nm. In contrast, nanowires are similar in structure; however the lengths are significantly greater, e.g., up to several hundred micrometers or even in some cases in the centimeter range. Further, nanowires tend to have a greater flexibility than nanorods.

In accordance with the present invention, the nanostructures can have an aspect ratio of at least about 5:1. In one aspect the plurality of nanostructures can have an aspect ratio from about 10:1 to about 5000:1. Aspect ratios greater than 5000:1 can be used, although certain techniques used for applying the printable composition can involve additional considerations as discussed below which may limit the aspect ratio somewhat. In another embodiment, aspect ratios from about 10:1 to about 100:1 can be used to provide good surface contact among particles, while maintaining a stable dispersion.

In the printable compositions of the present invention, the plurality of nanostructures can comprise from about 1 wt % to about 70 wt % of the printable composition as a whole. In one detailed aspect, the plurality of nanostructures can comprise from about 1 wt % to about 40 wt % of the printable composition. The latter range is often useful for preparing ink-jettable compositions, while printable compositions having higher concentrations of nanostructures would be suitable for screen printing, roller printing, or the like. Additionally, consideration can be given to providing a concentration of nanostructure particles such that upon removal of any volatile components that may be present, the nanoparticles are in sufficient contact to provide a conductive path, either before or after sintering.

Stabilizing Agent

The nanostructures useful in the present invention are typically not independently stable in a liquid carrier, though this is not always the case. Specifically, the nanostructures tend to agglomerate and/or precipitate out of a dispersion or solution. In one embodiment of the present invention, the printable composition does not include a stabilizing agent. In such a case, the plurality of nanostructures can be independently stable, can be suspended by mixing, agitating, sonicating, stirring, or heating the printable composition immediately prior to use. Alternatively, the printable compositions of the present invention can optionally include a stabilizing agent. Accordingly, either during manufacture of the nanostructures or subsequent thereto, a stabilizing agent can be added to inhibit agglomeration and increase solubility of the plurality of nanostructures. A variety of stabilizing agents can be used to form a protective coating around individual nanostructure particles to prevent agglomeration by steric repulsion, electrostatic barriers or the like, which can be sufficient to keep the nanostructure particles dispersed in the liquid carrier. These stabilizing agents can include chemically attached functional groups to form a coating around individual particles, or can merely include a coating which physically surrounds individual nanostructure particles.

In accordance with the present invention, the stabilizing agent can be nanostructure surface attached ligands, nanostructure polymeric coatings, nanostructure metal coatings, nanostructure surfactant coatings, or a combination thereof. Exemplary nanostructure surface attached ligands suitable for use in the present invention can include, without limitation, carboxylates, thiolates, alkoxides, alkanes, alkenes, alkynes, diketonates, siloxanes, silanes, germanes, hydroxides, hydride, amides, amines, carbonyl, nitriles, aryl, and combinations thereof. Examples of carboxylates can include acetate, lactate, ethylhexanoate, benzoate, citrate, decanoate, neodeconate, oleate, pivalate, propionate, and the like. Suitable nanostructure polymeric coatings can include, for example, poly(divinylbenzene), poly(vinylbenzyl chloride), poly(pyrrole), poly(acrylate), poly(butyl methacrylate), polyvinyl alcohol and poly(N-isopropyl acrylamide).

In addition to stabilizing the plurality of nanostructures, surfactants can also alter substrate wetting properties and help in film formation on a substrate. Suitable surfactants that can be used include, but are not limited to, anionic, cationic, non-ionic, zwitterionic or amphoteric, and fluorosurfactants.

Non-limiting examples of non-ionic surfactants include polyoxyethylene nonyl phenyl ether, polyoxyethylene octyl phenyl ether, polyoxyethylene dodecyl phenyl ether, polyoxyethylene alkyl ethers, polyoxyethylene polyoxypropylene block copolymers, polyoxyethylene fatty acid esters, sorbitan fatty acid esters, polyoxyethylene sorbitan fatty acid esters, fatty acid alkylolamides, acetylenic diols, polyethoxylated fatty alcohols, glycerol esters, polyglycosides, and mixtures thereof. Non-limiting examples of anionic surfactants can include alkylbenzene sulphonates, alkylphenyl sulphonates, alkylnaphthalene sulphonates, formalin condensates of naphthalene sulphonates, higher fatty acid salts, sulphuric ester salts of higher fatty acid esters, sulphonates of higher fatty acid esters, sulphuric acid esters and sulphonates of higher alcohol ethers, alkylcarboxylates of higher alkylsulphonamides, sulphosuccinates, sulphosuccinic acid ester salts, and mixtures thereof. Examples of cationic surfactants can include primary, secondary and tertiary amine salts, quaternary ammonium salts, and mixtures thereof. Examples of amphoteric surfactants can include betaine, sulphobetaine, sulphate betaine, alkyl amine oxides, silicones, and mixtures thereof. Examples of polymeric surfactants can include polyamines, polyvinylalcohols, ethylene oxides, polyvinylpyrrolidones, polysiloxanes, polycarboxylic acids (methacrylates), alkyl acrylamides, and mixtures thereof.

In accordance with the present invention, the stabilizing agent can form a coating to form a core-shell nanomaterial. This coating can be a nanostructure metal coating formed of Ag, Au, Pt, Pd, Ni, or Co, or a metal or semimetal oxide such as $SiO_2$, $Al_2O_3$, AgO, and combinations thereof. Alternatively, the stabilizing agent can be a carbon nanostructure. In addition to stabilizing the nanostructure particles, such protective coatings can aid against oxidation of the nanostructure particles. For example, a thin coating of metallic palladium or nickel can be applied to a silicon nanowire to prevent oxidation while dispersed in the liquid carrier. Upon drying, curing, or sintering, the protective palladium or nickel shell can also aid in intra-crystal grain growth by metal silicide formation at grain boundaries. Such metal coatings can be as thin as possible such that the coating would be consumed readily upon silicide formation.

Various stabilizing agents can also enhance solubility of the particles in specific solvents. For example, stabilizing groups that facilitate stability in water can include, but are not limited to, carboxylates, hydroxyl, sulfates, sulfonates, phosphonates, ammonium salts, and polyether glycols such as PEG.

The above mentioned coatings can be formed by conventional methods, such as being formed in situ by adding the stabilizing agent into the reaction medium during the synthesis of the nanostructures, or can be formed afterwards by surface modification techniques. For example, layer-by-layer deposition is a common method for forming polymer coatings on nanostructures. Other methods for forming such coatings can also be used as are known by those skilled in the art, and are considered within the scope of the present invention.

Liquid Carrier

The liquid carrier of the present invention can include one or more of a variety of different agents including, without limitation, surfactants, solvents, co-solvents, buffers, biocides, viscosity modifiers, molecular precursors, complexing agents, chelating agents, anti-kogation agents, reactive agents such as reducing agents, and water. Choice of specific components can depend on the printing method employed to apply the printable compositions of the present invention to a substrate, as well as the stabilizing agent as discussed in connection with the nanostructures below. Various components can be added to alter the viscosity, surface tension, pH, or the like of the printable composition.

A wide variety of solvents can be used as the primary constituent of the liquid carrier. Suitable solvents can include hydrocarbons, alcohols, ethers, organic acids, esters, aromatics, amines, water, and mixtures thereof. In one embodiment the organic solvent can be a water miscible organic solvent or a mixture comprising such solvents. Exemplary water miscible organic solvents include, without limitation, terpineol, citronellol, geraniol, nerol, hydroxyethylmorpholine, and alkanols such as C1-6 alkanols, e.g., methanol, ethanol, n-propanol, isopropanol, n-butanol, sec-butanol, tert-butanol, n-pentanol, cyclopentanol, and cyclohexanol; linear amides such as dimethylformamide or dimethylacetamide; ketones and ketone alcohols such as acetone, methyl ethyl ketone, cyclohexanone and diacetone alcohol; water miscible ethers such as tetrahydrofuran and dioxane; diols such as diols having from 2 to 12 carbon atoms, for example pentane-1,5-diol, ethylene glycol, propylene glycol, butylene glycol, pentylene glycol, hexylene glycol, thiodiglycol, and oligo- and poly-alkyleneglycols; triols such as glycerol and 1,2,6-hexanetriol; mono-C1-4-alkyl ethers of diols such as mono-C1-4-alkyl ethers of diols having 2 to 12 carbon atoms, especially 2-methoxyethanol, 2-(2-methoxyethoxy)ethanol, 2-(2-ethoxyethoxy)-ethanol, 2-[2-(2-methoxyethoxy)ethoxy]ethanol, 2-[2-(2-ethoxyethoxy)-ethoxy]-ethanol and ethylene glycol monoallylether; cyclic amides such as 2-pyrrolidone, N-methyl-2-pyrrolidone, N-ethyl-2-pyrrolidone, caprolactam and 1,3-dimethylimidazolidone; cyclic esters such as caprolactone; sulphoxides such as dimethyl sulphoxide and sulpholane. The liquid carrier of the present invention can include one or more of such solvents. Frequently, the liquid carrier can include water and two or more, especially from two to eight, water miscible organic solvents. In one aspect, the liquid carrier can include water miscible organic solvents such as cyclic amides, especially 2-pyrrolidone, N-methyl-pyrrolidone and N-ethyl-pyrrolidone; diols, especially 1,5-pentane diol, ethylene glycol, propylene glycol, thiodiglycol, diethylene glycol and triethylene glycol; mono-C1-4-alkyl and C1-4-alkyl ethers of diols such as mono-C1-4-alkyl ethers of diols having 2 to 12 carbon atoms, especially 2-methoxy-2-ethoxy-2-ethoxyethanol; and triols especially glycerol. In another embodiment of the present invention the solvent can be water immiscible, i.e. non-polar. Suitable non-polar solvents include, without limitation, toluene, xylene, nonane, dodecane, hexane, heptane, octanane, cyclohexane, decaline, tetracene, and mixtures thereof. Any of the above listed solvents can be used singly or multiple solvents can be used in combination. Although the amount of solvent can vary depending on the technique used to apply the printable composition and other components, the liquid carrier can be from about 30 wt % to about 99 wt % of the printable composition. In one embodiment, the liquid carrier can include a solvent having a boiling point greater than 90° C.

As described, cosolvents can also be included in the printable compositions of the present invention. Suitable cosolvents for use in the present invention include water soluble organic cosolvents, but are not limited to, aliphatic alcohols, aromatic alcohols, diols, glycol ethers, poly(glycol) ethers, lactams, formamides, acetamides, long chain alcohols, ethylene glycol, propylene glycol, diethylene glycols, triethylene glycols, glycerine, dipropylene glycols, glycol butyl ethers, polyethylene glycols, polypropylene glycols, amides, ethers, carboxylic acids, esters, organosulfoxides, sulfones, alcohol derivatives, carbitol, butyl carbitol, cellosolve, ether derivatives, amino alcohols, and ketones. For example, cosolvents can include primary aliphatic alcohols of 30 carbons or less, primary aromatic alcohols of 30 carbons or less, secondary aliphatic alcohols of 30 carbons or less, secondary aromatic alcohols of 30 carbons or less, 1,2-diols of 30 carbons or less, 1,3-diols of 30 carbons or less, 1,5-diols of 30 carbons or less, ethylene glycol alkyl ethers, propylene glycol alkyl ethers, poly(ethylene glycol) alkyl ethers, higher homologs of poly(ethylene glycol) alkyl ethers, poly(propylene glycol) alkyl ethers, higher homologs of poly(propylene glycol) alkyl ethers, lactams, substituted formamides, unsubstituted formamides, substituted acetamides, and unsubstituted acetamides. Specific examples of cosolvents that can be used in the practice of this invention include, but are not limited to, 1,5-pentanediol, 2-pyrrolidone, 2-ethyl-2-hydroxymethyl-1, 3-propanediol, diethylene glycol, 3-methoxybutanol, and 1,3-dimethyl-2-imidazolidinone. Cosolvents can be added to reduce the rate of evaporation of liquid vehicle to minimize clogging or other properties of the printable composition such as viscosity, pH, surface tension, and resulting print quality. The cosolvent concentration can range from about 0 wt % to about 50 wt %, and in one embodiment can be from about 15 wt % to about 30 wt %. Multiple cosolvents can also be used, wherein each cosolvent can typically be present at from about 2 wt % to about 10 wt % of the printable composition.

Various buffering agents can also be optionally used in the printable compositions of the present invention. Typical buffering agents include such pH control solutions as hydroxides of alkali metals and amines, such as lithium hydroxide, sodium hydroxide, and potassium hydroxide; and other basic or acidic components. If used, buffering agents typically comprise less than about 10 wt % of the printable composition.

In another aspect of the present invention, various biocides can be used to inhibit growth of undesirable microorganisms during manufacture, storage, and use. Several non-limiting examples of suitable biocides include benzoate salts, sorbate salts, commercial products such as NUOSEPT (Nudex, Inc., a division of Huls America), UCARCIDE (Union Carbide), VANCIDE (RT Vanderbilt Co.), and PROXEL (ICI Americas) and other known biocides. Examples of several specific suitable biocides include, without limitation, isothiazolin-3-ones such as 4,5-trimethylene-4-isothiazolin-3-one, 2-methyl-4,5-trimethylene-4-isothiozolin-3-one, 2-methylisothiazolin-3-one, 5-chloro-2-methylisothiazolin-3-one, 2-octylisothiazolin-3-one, 4,5-dichloro-2-octyltisothiazolin-3-one, benzisothiazolin-3-one, 2-butylbenzisothiazolin-3-one and 2-methylbenzisothiazolin-3-one; thiazole derivatives such as 2-(thiocyanomethylthio)-benzthiazole and mercaptobenzthiazole; nitro compounds such as tris(hydroxymethyl) nitromethane, 5-bromo-5-nitro-1,3-dioxane and 2-bromo-2-nitropropane-1,3-diol; aldehydes and derivatives thereof such as gluteraldehyde (pentanedial), p-chlorophenyl-3-iodopropargyl formaldehyde and glyoxal; guanidine derivatives such as polyhexamethylenebisbiguanide and 1,6-hexamethylene-bis[5-(4-chlorophenyl)biguanide]; thiones such as 3,5-dimethyltetrahydro-1,3,5-2H-thiodiazine-2-thione; triazine derivatives such as hexahydrotriazine and 1,3,5-tri-(hydroxyethyl)-1,3,5-hexahydrotriazine; oxazolidine and derivatives thereof such as bis-oxazolidine; furan and derivatives thereof such as 2,5-dihydro-2,5-dialkoxy-2,5-dialkylfuran; carboxylic acids and the salts and esters thereof such as sorbic acid and the salts thereof and 4-hydroxybenzoic acid and the salts and esters thereof; phenol and derivatives thereof such as 5-chloro-2-(2,4-dichlorophenoxy)phenol, thio-bis(4-chlorophenol) and 2-phenylphenol. Such biocides can be used singly or two or more biocides can be used in combination. Typically, biocides comprise less than about 5 wt % of the printable composition and often from about 0.1 wt % to about 0.25 wt %.

In one aspect of the present invention, the printable compositions can optionally contain surfactants. It is noted that such surfactants are distinct from the discussion below regarding surfactant coatings of the nanostructure particles, although some of the same surfactants can be used for both aspects of the present invention. Suitable surfactants can be used and may include standard water soluble surfactants such as alkyl polyethylene oxides, alkyl phenyl polyethylene oxides, polyethylene oxide (PEO) block copolymers, acetylenic PEO, PEO esters, PEO amines, PEO amides, dimethicone copolyols, and mixtures thereof. If used, surfactants can be from 0.01% to about 10% by weight of the printable composition.

Other Optional Ingredients

The printable compositions of the present invention can also include various additional components such as molecular precursors, colorants, and other additives known to those skilled in the art. Such additional components can be included in the printable composition to aid in film morphology, adhesion, void filling, substrate wetting, and self assembly mechanisms.

In one aspect of the present invention, molecular precursors can be added to aid the fusion process between crystal grains during sintering or curing. Suitable molecular precursors can include organometallic complexes, inorganic complexes, and inorganic salts. As such, the molecular precursor can typically form part of the final conductive path. Such molecular precursors can contain an element or elements that will form a part of the final conductive path. Molecular precursors can be a dissolved solid, or can be a liquid precursor which acts as a solvent of the liquid carrier. The molecular precursor can form a metal or compound which can be the same as, or different from, the material which comprises the nanostructures. For example, the molecular precursor can be a metal complex or salt of the material used to form the plurality of nanostructures.

In addition, upon curing, the molecular precursor may be a source of dopant to a semiconducting film. Of course, materials can be chosen such that the precursor forms a conductive path among particles, and further aids in providing a nearly continuous structure along the conductive path. This can be accomplished by evaporation of solvent, decomposing the molecular precursor, or the like. For example, a printable composition for printing of ZnO films can include ZnO nanowires and a zinc precursor. The zinc precursor can thermally decompose to ZnO under appropriate processing temperatures and conditions. In this way, voids between nanostructure particles can be at least partially filled and the ZnO thus formed can aid in crystal growth among the particles to provide improved conductive paths. For example, non-limiting suitable organometallic precursors for a ZnO printable formulations can include, zinc acetate, zinc 2-ethylhexanoate, zinc oleate, zinc methoxyethoxide, zinc neodecanoate or zinc 2,4-petanedionate. For a ZnS composition the organometallic precursors may include zinc diethyldithiocarbamate or zinc diethylthiolate. For a copper composition the organometallic precursor can include copper hexafluoropentanedionate vinyltrimethylsilane or copper hexafluoropentanedionate. As a general guideline, molecular precursors, if used, can comprise from about 0.1 wt % to about 99 wt % of the printable composition.

Other additives can also be utilized for producing particular commercial products, such as a colorant to impart additional desired color to the conductive path. In one embodiment, the printable composition can include pigment and/or dye colorant which can be used for aesthetic purposes or to identify specific traces. Reactive additives may also be added to the printable formulation, wherein upon activation, the additive aids in film formation. For example, reducing agents may be added to help with the decomposition of molecular precursors or other organic surfactants. Reducing agents that can be used include, but are not limited to hydrazine, dimethyl hydrazine, diphenyl hydrazine, primary alcohols, dimethyl sulfide and borohydrides.

Forming Conductive Paths

The printable compositions of the present invention can be used in forming a conductive path on a substrate. In accordance with the present invention, the printable compositions can be applied onto a substrate using any of a variety of techniques such as, but not limited to, ink-jetting, screen printing, gravure printing, liquid embossing, offset printing, thermal spray deposition, microsyringe dispensing, and roller coating. Suitable substrates can include ceramics, polymers, cellulose, glass, silicon, organic substrates, metal oxides, phenolic materials, wafer boards, epoxy glasses, electrically compatible plastics, and combinations or composites thereof. Examples of several specific substrates include standard silicon substrate, polyethylene terephthalate (available from E.I. du Pont de Nemours and Company as MYLAR), polyimides (available from E.I. du Pont de Nemours and Company as KAPTON), epoxy resins, phenolic resins, polyester resins, aluminum nitride, and alumina ceramic. Although the above mentioned substrates are suitable, almost any non-conductive material or flexible or non-flexible dielectric material can be used as the substrate in the present invention. In addition, the methods of the present invention can be applied to substrates having previously formed electronic circuits and/or devices thereon using any known method.

The unique nanostructures of the present invention allow for significant portions of each particle to be in contact with an adjacent particle upon removal of at least a portion of the liquid carrier. The relatively high aspect ratio of particles used in the present invention can significantly decrease interstitial voids over spherical, or nearly spherical, particles. Thus, the plurality of nanostructures can be in sufficient contact to provide the conductive path, even without additional sintering or processing. Additionally, the nanoparticles of the present invention can be distributed on the substrate in a random fashion. As such, the orientation of individual particles in the final conductive path can be the result of a somewhat random stacking of particles. A large portion of the nanostructures will typically be stacked along their lengths, thus providing contact between particles along an entire surface or portion thereof. In an alternative embodiment, particles can be aligned on the substrate in order to further improve electron mobility. Several methods for particle alignment may be used and can include surface modification and application of electrostatic force, application of an electric field, use of templates, and other known methods.

Depending on the technique used to apply the printable composition, these compositions can be formulated to deliver a thin liquid film onto the substrate in a pattern which corresponds to a desired conductive path. Optionally, the films can then be processed to form the desired conductive path. In one aspect, the film can be processed by removing at least a portion of the liquid carrier. This can include merely allowing the film to dry at ambient conditions or can involve heating the film to a temperature sufficient to drive off volatile components.

In accordance with the present invention, other processing steps that can be used include thermal, ultraviolet, laser treatment, or other similar processing steps. Such processing can be completed under a controlled atmosphere, e.g., $O_2$, $N_2$; vacuum, $H_2$; $NH_3$ etc. It is often preferable during the processing step that essentially all undesirable impurities are removed as volatile by-products. Thus, the solvent, surfactants, polymers, biocide, ligands, or other components are therefore typically removed as volatile organic compounds from the final conductive path. Although temperatures can vary depending on the components of the printable composition, typical removal processing can be carried out from about 40° C. to about 400° C.

In yet another aspect of the present invention, the substrate can be heated sufficient to sinter the plurality of nanostructures. Any number of heating apparatuses can be used such as microwaves, lasers, rapid thermal annealing ovens, ultraviolet heaters, heater bars, heat lamps, heating plates, forced heated air, furnace, or other known heat sources. One benefit of the using the nanostructures of the present invention is a significant depression of the melting point. Thus, for many nanostructure materials, the melting point is from about several degrees to several hundred degrees lower than the corresponding bulk material. This is thought to be the result of the high surface area to mass or volume ratio. For example, germanium nanowires encased in carbon nanotubes of from 10 nm to 100 nm in diameter and about 1 μm in length begins melting at about 650° C. and completely melts around 850° C. Upon cooling, the germanium recrystallizes at about 560° C. Interestingly, the melting point of bulk germanium is 930° C. A similar depression of melting points occurs for substantially all of the nanostructures suitable for use in accordance with embodiments of the present invention, although the extent of the phenomena can vary considerably. Thus, the nanostructures disclosed herein can be used to produce conductive paths at much lower temperatures than may normally be required.

This phenomenon also decreases the amount of heat needed, and thus expense, as well as minimizes potential damage to many substrates which can occur when such are subjected to high temperatures. Additionally, it is not required that the nanostructures completely melt. As such, sintering, i.e. melting and formation of bridges at contact points between particles, can occur over a greater surface area of nanostructure particles than would be observed for larger particles or even nanoparticles having an aspect ratio closer to 1:1. The surface contact between individual nanostructure particles not only reduces interstitial voids, but also improves contact such that sintering can result in a continuous uninterrupted path for electrons to flow. The elongated dimensions of the nanostructures of the present invention result in a decreased number of grain boundaries along the conductive path having fewer defects, which improves electron mobility. Studies have shown that generally an increase in grain size results in a corresponding increase in electron mobility. As mentioned above, sintering temperatures will vary according to the specific nanostructure material, however typical sintering temperatures can range from about 150° C. to about 900° C., and often ranges from about 200° C. to about 700° C.

The conductive paths produced in accordance with the principles of the present invention can form a wide variety of electronic devices, and the resolution and complexity of such paths are only limited by the printing technique chosen for application of the printable composition. Conductive paths can include, for example, a complex circuit, single trace, antenna, multilayered circuit, transistor, resistor, inductor, gate, diode, capacitor, magnet, and combinations thereof. Alternatively, the conductive path can be a conductive pattern that can be formed as an aesthetic, decorational, or informational design.

Conductive paths formed using the printable composition of the present invention can have a linewidth of from about 0.1 μm up to any practical width. Generally, a width of from 2 to 10 millimeters is the widest practical width. However, wider patterns can be formed depending on the application. In one aspect of the present invention, linewidths can be from about 15 μm to about 500 μm. Those skilled in the art will recognize, upon review of the present disclosure, that linewidths can be affected by the rate of evaporation and the porosity of specific substrates. For example, in one embodiment, the substrate can be heated prior to applying the printable composition thereto. In such embodiments, the printable composition can experience a decrease in viscosity as the composition is heated due to contact with the substrate, followed by an increase in viscosity due to solvent evaporation. These competing effects can be adjusted by those skilled in the art to achieve specific linewidths and edge acuities.

Similarly, the conductive path can have varying depths as measured from the substrate to an upper surface of the conductive path. The depth of the conductive, or semiconductive, material can be easily controlled by the application technique during printing of the printable compositions. Namely, the depth of the conductive path is governed by the particular solution, viscosity, and concentrations used. Additionally, the depth can be increased by repeating the application, removal, and/or sintering steps as many times as necessary to achieve a desired depth. The depth of the conductive path can range from about 0.01 μm to about 100 μm, although depths of from about 0.1 μm to about 20 μm are sufficient for most electronic devices.

In one aspect of the present invention, the conductive path can be printed in multiple layers to form three dimensional structures. For example, a first layer containing a conductive path can be formed by using any of the above described embodiments. A layer of insulating or semi-conducting material of a polymeric resin, organic resin, doped ceramic, semiconductor, or the like, can be formed over the first layer. Most often, the insulating layer can be discontinuous having conduits or holes in which additional conductive material can be placed. These holes can be formed after deposition of the insulating material using the printing techniques disclosed herein or standard lithography technologies. A conductive path can then be printed using the methods of the present invention, or otherwise deposited. Alternatively, the holes can be formed by printing a material prior to forming the insulating material, which can prevent the insulating material or semi-conducting material from adhering to the conductive path at specific locations. A second layer of conductive circuits or paths can then be printed on the insulating material using the above principles. This process can be repeated as many times as needed to form a desired multilayer circuit and is often printed on an existing pattern.

In one aspect of the present invention, the printable composition can be applied to a substrate using ink-jet techniques. A system for forming conductive paths on a substrate can include a printhead having a firing chamber reservoir containing an ink-jettable composition. The ink-jettable composition can include at least a liquid vehicle, a plurality of nanostructures having an aspect ratio of at least about 5:1 within the liquid vehicle, and a stabilizing agent configured to inhibit agglomeration of the plurality of nanostructures. A standard ink-jet printer, for example, can be used to propel ink-jet compositions onto substrates using resistive heating elements or piezoelectric elements for propelling the composition through an overlying orifice plate. The ink-jet compositions can be stored in a reservoir and the composition can travel through a set of micro-channels toward the orifice plate. In connection with the present invention, the printhead can have a firing chamber reservoir containing the ink-jettable composition.

Current ink-jet technology allows for orifice sizes of from about 15 μm to about 100 μm. Thus, the minimum linewidth is currently limited to about this range, although future developments may allow for smaller orifice sizes and decreased linewidths. Additionally, the size of the orifice can affect the practical length of any nanostructures present in the printable composition. The plurality of nanostructures can have almost any practical length which can be several times the orifice size. This is especially true for highly flexible nanostructures having a high aspect ratio such as with nanowires. In order to reduce potential clogging of the printing orifice and/or micro-channels, one embodiment of the present invention can include nanostructures having an average length which is from about 5% to about 80% of the orifice size.

Ink-jetting techniques can often require formulation of ink-jettable compositions which are tailored to various ink-jet pens, including thermal, piezoelectric, sonic impulse, or other known ink-jet printing systems. The ink-jettable compositions of the present invention can include a variety of components such as those typically used in ink-jet liquid vehicles, such as, but not limited to solvents, cosolvents, surfactants, biocides, buffers, viscosity modifiers, sequestering agents, colorants, stabilizing agents, humectants, water, and mixtures thereof. Several considerations in selecting the amount of liquid vehicle include those related to nucleation such as heat capacity, heat of vaporization, critical nucleation temperature, diffusivity, and the like. For example, aqueous liquid vehicles often have at least 5% to 10% water to provide sufficient nucleation in thermal ink-jet systems.

Typically, the ink-jettable compositions for use in thermal ink-jet systems can have a viscosity of from about 0.8 cP to about 20 cP, and in some cases, can be up to 50 cP. Similarly, ink-jettable compositions for use in piezoelectric ink-jet systems can have a viscosity of from about 2 cP to about 15 cP, and in some cases, can be up to 30 cP. Although a variety of viscosity modifiers can be used, several common compounds include 2-pyrrolidone, isopropyl alcohol, glycerol, and the like.

Similarly, the surface tension of ink-jettable compositions used in thermal ink-jet systems can range from about 25 dyne/cm$^2$ to about 75 dyne/cm$^2$, and in some embodiments, can be from about 30 to about 55 dyne/cm$^2$. The surface tension can be adjusted using compounds such as isopropyl alcohol, ethanol, methanol, glycerol, water, and the like. In one aspect of the present invention, the liquid vehicle can comprise from about 60 wt % to about 99 wt % of the ink-jettable composition. Various techniques can be used to modify the viscosity or other jetting properties of the ink-jettable compositions herein. For example, heat can be used to liquefy material, increase solubility of the material, or reduce viscosity such that it becomes ink-jettable. Those skilled in the art will recognize that the above discussion is primarily focused on thermal ink-jet systems, as piezoelectric ink-jet systems involve less restrictive considerations. For example, thermal ink-jet systems are typically operated at temperatures below about 80° C., while piezoelectric ink-jet systems can be operated at temperatures of up to about 150° C. In light of the present disclosure, those skilled in the art will recognize which components can be included in the liquid vehicle in order to ink-jet compositions of the present invention from thermal, piezoelectric, or other ink-jet systems. Those skilled in the art can adjust these and other variables to achieve a variety of resolutions and conductive paths.

The following examples illustrate exemplary embodiments of the invention. However, it is to be understood that the following is only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following examples provide further detail in connection with what is presently deemed to be practical embodiments of the invention.

EXAMPLES

Example 1

A printable composition is prepared using ZnO nanowires having average dimensions of 20 nm by 300 nm, and additional components in quantities as described in Table 1.

TABLE 1

| Table 1 Weight Percent | Component |
| --- | --- |
| 5.0% | ZnO nanowires |
| 5.0% | Zn(2-ethylhexanoate)$_2$ |
| 2.0% | 2-ethylhexanoic acid |
| 88% | Terpineol |

The printable composition is then printed on a glass substrate using screen printing to form a simple circuit having linewidths of about 200 μm. The substrate is then heated on a heating plate to about 540° C. for about 60 minutes to cause sintering of the ZnO nanowires to form a conductive path. The resulting path has an electron mobility of about 2.3 cm$^2$/Vcm.

Example 2

A printable composition is prepared using ZnO nanowires having average dimensions of 20 nm by 300 nm, and additional components in quantities as described in Table 2.

TABLE 2

| Weight Percent | Component |
|---|---|
| 5.0% | ZnO nanowires (passivated with hydrophilic ligands) |
| 3.0% | Zn(NO$_3$)$_2$.6H$_2$O |
| 2.0% | tetrahydrofuran |
| 90% | Water |

The printable composition is then printed on a glass substrate using an ink-jet printer to form a simple circuit having channel widths of about 400 µm. The substrate is then heated on a heating plate to about 540° C. for about 60 minutes to cause sintering of the ZnO nanowires to form a conductive path. The resulting path has an electron mobility of about 2.3 cm$^2$/Vcm.

Several HP thermal ink-jet pens have been tested in ejecting fluids containing nanostructure materials. Tests have been performed using THINKJET (12 nozzles), DESKJET 1200 (104 nozzles), DESKJET 1600 (300 nozzles), and 2000C (304 nozzles), and others. These ink-jet pens have nozzle sizes varying from 100 µm to 20 µm, and droplet size from 200 picoliters to 8 picoliters.

It is to be understood that the above-referenced arrangements are illustrative of the application for the principles of the present invention. Thus, while the present invention has been described above in connection with the exemplary embodiments of the invention, it will be apparent to those of ordinary skill in the art that numerous modifications and alternative arrangements can be made without departing from the principles and concepts of the invention as set forth in the claims.

The ivention claimed is:

1. A printable composition, comprising:
    a) a liquid carrier;
    b) a plurality of nanostructures having an aspect ratio of at least about 5:1 within the liquid carrier; and
    c) a stabilizing agent configured to inhibit agglomeration of the plurality of nanostructures, said stabilizing agent being a nanostructure surface attached ligand, nanostructure polymeric coating, metal coating, semimetal oxide coating, or metal oxide coating.

2. The composition of claim 1, wherein the plurality of nanostructures are selected from the group consisting of nanobelts, nanoplates, nanodiscs, nanowires, nanorods, and combinations thereof.

3. The composition of claim 2, wherein the plurality of nanostructures are selected from the group consisting of nanobelts, nanoplates, nanodiscs, and combinations thereof.

4. The composition of claim 1, wherein the plurality of nanostructures are nanowires or nanorods.

5. The composition of claim 1, wherein the plurality of nanostructures have an aspect ratio of at least about 10:1.

6. The composition of claim 5, wherein the plurality of nanostructures have an aspect ratio of from about 10:1 to about 5000:1.

7. The composition of claim 1, wherein the plurality of nanostructures are inorganic.

8. The composition of claim 1, wherein the plurality of nanostructures are doped.

9. The composition of claim 1, wherein the stabilizing agent is a nanostructure metal or metal oxide coating selected from the group consisting of Ag, Au, Pt, Pd, Ni, Co, SiO$_2$, Al$_2$O$_3$, AgO, and combinations thereof.

10. The composition of claim 1, wherein the stabilizing agent is a nanostructure surface attached ligand selected from the group consisting of carboxylates, thiolates, alkoxides, alkanes, alkenes, alkynes, diketonates, siloxanes, silanes, germanes, hydroxides, hydride, amides, amines, carbonyl, nitriles, aryl, and combinations thereof.

11. The composition of claim 1, wherein the stabilizing agent is a nanostructure polymeric coating.

12. The composition of claim 1, further comprising a molecular precursor.

13. The composition of claim 12, wherein the molecular precursor is a metal salt selected from the group consisting of organometallic complexes, inorganic complexes, and inorganic salts.

14. The composition of claim 1, wherein the plurality of nanostructures comprise from about 1 wt % to about 70 wt % of the printable composition.

15. The composition of claim 1, further comprising a colorant.

16. The composition of claim 1, wherein said liquid carrier is a liquid vehicle, and the printable composition is ink-jettable.

17. The composition of claim 16, wherein the plurality of nanostructures comprise from about 1 wt % to about 40 wt % of the printable composition.

18. The composition of claim 1, wherein the liquid carrier includes a solvent having a boiling point greater than 90° C.

19. A substrate having a printable composition printed thereon in a predetermined pattern, said printable composition including:
    a) a liquid carrier;
    b) a plurality of nano structures having an aspect ratio of at least about 5:1 within the liquid carrier; and
    c) a stabilizing agent configured to inhibit agglomeration of the plurality of nanostructures, said stabilizing agent being a nanostructure surface attached ligand, nanostructure polymeric coating, metal coating, semimetal oxide coating, or metal oxide coating.

20. The substrate of claim 19, wherein the plurality of nanostructures are selected from the group consisting of nanobelts, nanoplates, nanodiscs, nanowires, nanorods, and mixtures thereof.

21. The substrate of claim 19, wherein the plurality of nanostructures have an aspect ratio of at least about 10:1.

22. The substrate of claim 19, wherein the stabilizing agent is a nanostructure surface attached.

23. The substrate of claim 19, wherein the substrate comprises a member selected from the group consisting of ceramics, polymers, cellulose, glass, silicon, organic substrates, metal oxides, and mixtures or composites thereof.

24. The substrate of claim 19, wherein the plurality of nanostructures are sintered on the substrate.

25. A method of forming a conductive path on a substrate, comprising:
    a) applying a printable composition onto a substrate, said printable composition including:
        i) a liquid carrier; and
        ii) a plurality of nano structures having an aspect ratio of at least about 5:1 within the liquid carrier; and b) removing at least a portion of the liquid carrier, wherein the plurality of nano structures are in sufficient contact to provide the conductive path, said conductive path being a trace, transistor, resistor, inductor, gate, diode, capacitor, magnet, or combination thereof.

26. The method of claim 25, wherein said nanostructures are a member selected from the group consisting of nanobelts, nanoplates, nanodiscs, nanowires, nanorods, and mixtures thereof.

27. The method of claim 25, wherein the plurality of nanostructures have an aspect ratio of greater than 10:1.

28. The method of claim 25, wherein the printable composition further comprises a stabilizing agent configured to inhibit agglomeration of the plurality of nanostructures.

29. The method of claim 25, wherein the substrate comprises a member selected from the group consisting of ceramics, polymers, cellulose, glass, silicon, organic substrates, metal oxides, and mixtures or composites thereof.

30. The method of claim 25, further comprising heating the substrate sufficient to sinter the plurality of nano structures.

31. The method of claim 30, wherein said heating is performed at from about 150° C. to about 900° C.

32. The method of claim 25, wherein the conductive path has a linewidth of from about 15 μm to about 100 μm.

33. The method of claim 25, wherein said printable composition is applied using a technique selected from the group consisting of ink-jetting, screen printing, gravure printing, embossing, offset printing, and roller coating.

34. The method of claim 33, wherein said technique is ink-jetting.

35. The method of claim 34, wherein said ink-jetting is performed using an ink-jet printhead having an orifice size of from about 15 μm to about 100 μm.

36. The method of claim 35, wherein said plurality of nanostructures have an average length which is from about 5% to about 80% of the orifice size.

37. A system for forming conductive paths on a substrate, comprising a printhead having a firing chamber reservoir containing an ink-jettable composition, said ink-jettable composition including a liquid vehicle; a plurality of nanostructures having an aspect ratio of at least about 5:1 within the liquid vehicle; and a stabilizing agent configured to inhibit agglomeration of the plurality of nanostructures, said stabilizing agent being a nanostructure surface attached ligand, nanostructure polymeric coating, metal coating, semimetal oxide coating, or metal oxide coating.

38. A printable composition, comprising:
a) a liquid carrier;
b) a plurality of nanostructures having an aspect ratio of at least about 5:1 within the liquid carrier; and
c) a stabilizing agent configured to inhibit agglomeration of the plurality of nanostructures, said stabilizing agent being a nanostructure surface attached ligand, nanostructure polymeric coating, metal coating, semimetal oxide coating, or metal oxide coating.

39. A printable composition, comprising:
a) a liquid carrier;
b) a plurality of nanostructures having an aspect ratio of at least about 5:1 within the liquid carrier;
c) a molecular precursor; and
d) a stabilizing agent configured to inhibit agglomeration of the plurality of nanostructures, said stabilizing agent being a nanostructure surface attached ligand, nanostructure polymeric coating, metal coating, semimetal oxide coating, or metal oxide coating.

* * * * *